US010084213B2

(12) United States Patent
Petrella (10) Patent No.: US 10,084,213 B2
(45) Date of Patent: *Sep. 25, 2018

(54) PORTABLE RENEWABLE ENERGY POWER SYSTEM

(71) Applicant: Unlimited Power, Ltd., Greenville, SC (US)

(72) Inventor: Christopher J. Petrella, Greenville, SC (US)

(73) Assignee: Unlimited Power, Ltd., Greenville, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/829,465

(22) Filed: Dec. 1, 2017

(65) Prior Publication Data

US 2018/0090796 A1 Mar. 29, 2018

Related U.S. Application Data

(63) Continuation of application No. 14/630,341, filed on Feb. 24, 2015, now Pat. No. 9,865,903.

(60) Provisional application No. 61/966,378, filed on Feb. 24, 2014.

(51) Int. Cl.
| | |
|---|---|
| *H02J 7/00* | (2006.01) |
| *H01M 10/46* | (2006.01) |
| *H02M 7/44* | (2006.01) |
| *H02J 7/35* | (2006.01) |
| *H02S 40/32* | (2014.01) |

(52) U.S. Cl.
CPC ........ *H01M 10/465* (2013.01); *H02J 7/0047* (2013.01); *H02J 7/35* (2013.01); *H02M 7/44* (2013.01); *H02S 40/32* (2014.12)

(58) Field of Classification Search
USPC ........................................................ 320/101
See application file for complete search history.

(56) References Cited

U.S. PATENT DOCUMENTS

| | | | |
|---|---|---|---|
| 5,522,943 A | 6/1996 | Spencer et al. | |
| 5,969,501 A | 10/1999 | Glidden et al. | |
| 8,203,237 B1 * | 6/2012 | Cowles | H02J 7/355 307/150 |
| 2005/0093514 A1 | 5/2005 | Shimizu | |
| 2008/0029153 A1 | 2/2008 | Margalit | |
| 2009/0127933 A1 | 5/2009 | Simanazzi | |
| 2011/0176256 A1 | 7/2011 | Van Straten | |
| 2012/0187761 A1 | 7/2012 | Yanagi et al. | |
| 2012/0202094 A1 | 8/2012 | Sada | |
| 2012/0205975 A1 | 8/2012 | Takehara et al. | |

* cited by examiner

*Primary Examiner* — Samuel Berhanu
(74) *Attorney, Agent, or Firm* — Douglas Kim Law Firm, LLC; Douglas W. Kim (57) ABSTRACT

Various examples described herein are directed to portable renewable energy power systems comprising a solar module comprising a plurality of photovoltaic cells; a battery module comprising a plurality of battery cells; a user interface comprising at least one input device and at least one display; an alternating current/direct current (AC/DC) converter; a direct current/alternating current (DC/AC) converter; and a control module comprising at least one processor.

9 Claims, 5 Drawing Sheets

PORTABLE RENEWABLE ENERGY POWER SYSTEM

PRIORITY CLAIM

This application claims the benefit of U.S. patent application Ser. No. 14/630,341 filed on Feb. 24, 2015, which in turn claims priority on Provisional Patent Application Ser. No. 61/966,378 filed on Feb. 24, 2014, which are incorporated herein by reference in its entirety.

BACKGROUND

Various examples described herein are directed to portable renewable energy power systems and methods of operating the same.

FIGURES

Various examples are described herein in conjunction with the following figures, wherein.

DESCRIPTION

Various examples described herein are directed to portable renewable energy power systems (portable power systems) and methods of operating the same. Various portable power systems described herein may comprise a solar array-based battery charging system and a power inverter to generate outputs such as, for example, alternating current (AC). Portable power systems, as described herein, may be housed in a briefcase-type enclosure having dimensions similar to that of a briefcase. Various examples of portable power systems described herein may serve as power sources in remote locations or in back-up situations where the power supply must be portable, and/or if other power sources are not available.

Figure 1:
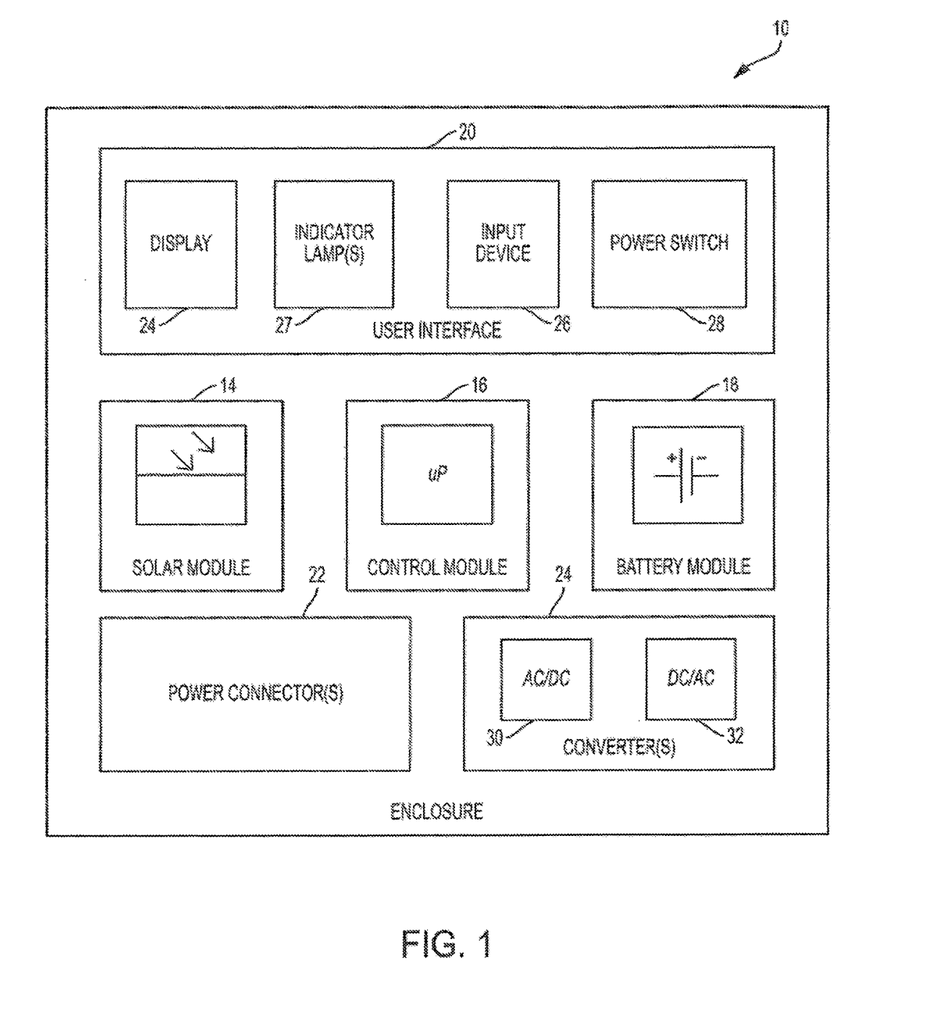
FIG. 1 is a block diagram showing one example of a portable power system.

FIG. 1 is a block diagram showing one example of a portable power system 10. The portable power system may comprise various components including, for example, a solar module 14, a battery module 18, a control module 16, a user interface module 20, one or more power connectors 22 and one or more converters 24. The modules 14, 16, 18, 20, 22, and 24 may positioned in an enclosure 12. In various examples, the various components of the portable power system 10 may be sized to enhance portability. For example, the enclosure 12 may have a size comparable to that of a briefcase or suitcase. The various components positioned in the enclosure 12 may be sized to fit within the enclosure, allowing the system 10 to be moved from place-to-place.

The solar module 14 may comprise any suitable type of photovoltaic cell or other device for converting solar energy into electricity. For example, the solar module 14 may comprise an array of photovoltaic cells. When the solar module 14 comprises photovoltaic cells, any suitable type of cell may be used including, for example, monocrystalline silicon solar cells, polycrystalline silicon solar cells, string ribbon solar cells, thin-film solar cells, amorphous silicon solar cells, cadmium telluride (CdTc) solar cells, copper indium gallium selenide (C1S/CIGS) solar cells, etc. In some examples, the solar module may comprise an array of photovoltaic cells configured to provide fifteen (15) Watts (W) of power at a maximum voltage of twenty-four (24) Volts. In some examples, the solar module may comprise an array of photovoltaic cells configured to provide about one hundred and fifty (150) W.

The battery module 18 may comprise one or more battery cells. The battery cells may be charged either from an external power source and/or by the solar module 14.

Battery cells included in the battery module 18 may be of any suitable type including, for example, lithium-ion cells, nickel-cadmium cells, lead-acid cells, etc. In some example, the battery module 18 may comprise four sealed lead acid battery cells connected in series. Each of the sealed lead acid battery cells may have a capacity of twelve (12) amp-hours and a voltage of six (6) Volts (V).

Converter module 24 may comprise one or more power converters 30 and 32 for converting power between alternating current (AC) and direct current (DC). An AC/DC converter 30 may convert alternating current to direct current. The AC/DC converter 30 may be configured to receive power from an external source (e.g., an electric outlet powered by the electric grid) and convert the received power to direct current for charging battery cells comprising the battery module 18. In this way, a user may plug-in the system 10 to charge the battery module 18. Any suitable AC/DC converter architecture may be used. In some examples, the AC/DC converter 30 may receive an input of between one hundred (100) and two-hundred and forty (240) V at between fifty (50) Hertz (Hz) and sixty (60) Hz. The AC/DC converter 30 may provide a direct current output of between twelve (12) V and twenty-four (24) V, with a maximum output current of ten (10) V at two-hundred and forty (240) W. In some embodiments, the AC/DC converter 30 may be solid state, for example, the AC/DC converter 30 may not have any moving parts. The AC/DC converter 30 may be configured to maximize battery life and minimize heat generation. In some examples, the converter may comprise a processor configured to execute battery management software. The battery management software may be configured to enhance battery life by sampling and adjusting the power in and out. Any suitable sampling and/or adjusting rate may be used. In this way, heat and strain on the circuits of the system may be reduced.

The converter module 24 may also comprise a DC/AC converter 32. The DC/AC converter 32 may be configured to receive power from a DC source, such as the solar module 14 and/or the battery module 18, and convert the received power into an AC current that may be used by traditional devices designed for use on an AC power grid. The DC/AC converter 32 may receive an input of about twelve (12) V and provide an AC output of between one-hundred fifteen (115) V and two-hundred and forty (240) V at between fifty (50) Hertz (Hz) and sixty (60) Hz. In some examples, the maximum output power is one-hundred fifty (150) W.

Power connector module 22 may comprise various connectors for providing and receiving power. For example, the power connector module 22 may comprise a connector for connecting the system 10 to a standard power grid to receive power, for example, to charge battery cells of the battery module 18. The power connector module 22 may also comprise one or more connectors for connecting the system 10 to one or more devices to be powered by the system (e.g., from the battery module 18 and/or the solar module 14). In some examples, a single connector may be used to both provide power to the system 10 from a standard power grid and to provide power from the system 10 to one or more devices.

The user interface 20 may comprise various components allowing a user to interact with and configure the system 10. The user interface 20 may comprise one or more displays 24, one or more input devices 26, one or more indicator lamps 27, and one or more power switches 28. The display 24 may comprise any suitable type of display including, for example, a display screen, a speaker, etc. The input device 26 may comprise any suitable device for providing input to the system including, for example, a keypad, a pointing device such as a mouse or touchpad, embedded membrane switches, etc. In some examples, the user interface 20 may comprise a touch screen that forms all or part of the display(s) 24 and all or part of the input device(s). In some examples, a touchpad may comprise a 1.7 inch diagonal liquid crystal display (LCD) integrated with an overlaid touch sensor and polyester overlay. Indicator lamps 27 may include lamps such as light emitting diodes (LEDs) or other suitable lamps. For example, indicator lamps 27 may indicate a mode or configuration of the system 10. The power switch 28 may be actuatable to turn the system 10 on and/or off.

The control module 16 may comprise one or more microprocessors and/or other control components configured to control the operation of the system 10. Any suitable microprocessor may be used. In some examples, the control module 16 may utilize a CORTEX M-3 microprocessor available from ARM. In some examples, the control module 16 may utilize an embedded microcontroller architecture. The control module 16 may be programmed to configure and monitor functional states of the system 10, monitor the condition of the battery module 18, and provide a graphical user interface (GUI) via the components of user interface 20. In some examples, the control module 16 may utilize one or more relays, transistors, or other switching elements to change the configuration or functional state of the system, for example, by changing the connectivity between the various components of the system 10. The system 10 may comprise various configurations or functional states that may be set by the control module 16, for example, in response to input received via the user interface 20.

According to an external charge configuration, the control module 16 may configure the system 10 to receive an AC signal via a power connector 22, convert the AC signal to a DC signal utilizing the AC/DC converter 30, and provide the DC signal to the battery module 18 to charge the battery cells. According to an internal charge configuration, the control module 16 may configure the system to route a DC signal generated by the solar module 14 to the battery module 18 to charge the battery cells. In some examples, the control system and/or the converter module 24 may comprise components for performing suitable AC/DC conversion to the DC signal generated by the solar module 14 so as to make it suitable for charging the battery module 18. According to a hybrid power configuration, the control module 16 may configure the system 10 to provide power to an external load (e.g., via power connector 22) from the solar module 14 and/or the battery module 18. For example, in the hybrid power configuration, the external load may be driven by the solar module 14 if it is providing enough power to drive the load (e.g., if the solar cells are deployed and in sufficient sunlight). If the solar module 14 does not provide sufficient power to drive the load, it may be supplemented by the battery module 18. According to a battery-only configuration, the control module 16 may configure the system 10 to provide power to the load from the battery only. According to a solar-only configuration, the control module 16 may configure the system 10 to provide power from the solar module 14 only. In some examples, the control module 16 may configure the system 10 to allow the solar module 14 to charge the battery module 18 while the system 10 is powering a load. For example, in the solar-only configuration and hybrid power configuration, the control module 16 may configure the system 10 such that solar power (if any) above what is needed to drive the load is provided to charge the battery module 18. In the battery-only mode, any power generated by the solar module 14 may be provided to charge the battery module 18.

The enclosure 12 may be made from any suitable material including, for example, plastic or plastic alloy components. For example, the enclosure 12 may comprise components made from injection-molded acrylonitrile butadiene styrene (ABS) or a suitable alloy thereof. In some examples, tooling may be developed for each plastic component. In some examples, the enclosure 12 may be made from a material that is impervious to deteriorative elements that are expected to be encountered during normal use such as, for example, outer elements such as snow, wind, and rain, knocks and bumps as users carry the system 10 from place to place, etc. In some examples, the enclosure 12 may be designed to support operational integrity and ergonomic factors in multiple orientations, as described herein.

Figure 2:
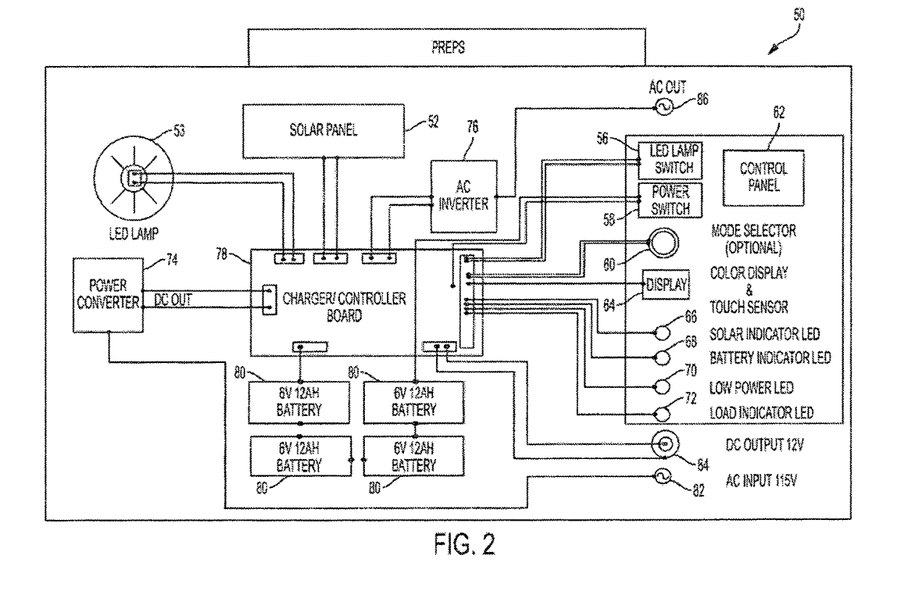
FIG. 2 is a block diagram showing another example of a portable power system.

FIG. 2 is a block diagram showing another example of a portable power system 50. In some examples, the portable power system 50 is an implementation of the system 10 described herein above. The system may comprise one or more solar panels 52, for example, part of the solar module 14 described above. The system 50 may additionally comprise a charger/controller board 78. For example, the charger/controller board 78 may comprise components for implementing the control module 16 including, for example, one or more microprocessors, microcontrollers, digital signal processors (DSPs), etc. The charger/controller board 78 may be in communication with batteries 80, which may make up all or part of the battery module 18. The charger controller board 78 may additionally be in communication with an AC/DC power converter 74 and a DC/AC converter or AC inverter 76. The power converter 74 may be connected to receive an AC input 82 and provide a DC output. The DC output may be connected by the charger/controller board 78 to charge the batteries 80 and/or may be connected to a DC output port 84, for example, to power devices configured to operate on a DC rail, such as twelve (12) V. The AC inverter 76 may be connected to receive a DC signal (e.g., from the power converter 74 and/or the solar panel 52). The DC signal may be provided to an AC out port 86. For example, the AC out port 86, the DC out port 84, and the AC input port 82 may be part of the power connector module 22 described herein.

In some examples, the system 50 further comprise an LED lamp 53, which may provide light to users configuring the device. A control panel 62 may comprise components making up the user interface 20 described herein above. For example, the control panel may comprise an LED lamp switch 56, which may be operative to light and extinguish the LED lamp 53. A power switch 58 may turn power to the system 50 on and off. A mode selector 60 may comprise a rotary or other switch allowing a user to select a configuration for the system 50. The display 64 may comprise an LCD touchscreen, as described above. A solar indicator LED or other lamp 66 may be programmed to light when the solar panel 52 is generating an electric signal. A battery indicator LED or other lamp may be programmed to light when the battery has reached a predetermined state (e.g., fully charged, nearly discharged, etc.). A low power LED 70 may be programmed to light when the system 50 is not capable of delivering its indicated power. A load indicator LED 72 may be configured to light when a load is present (e.g., across the AC output 86).

Figure 3:
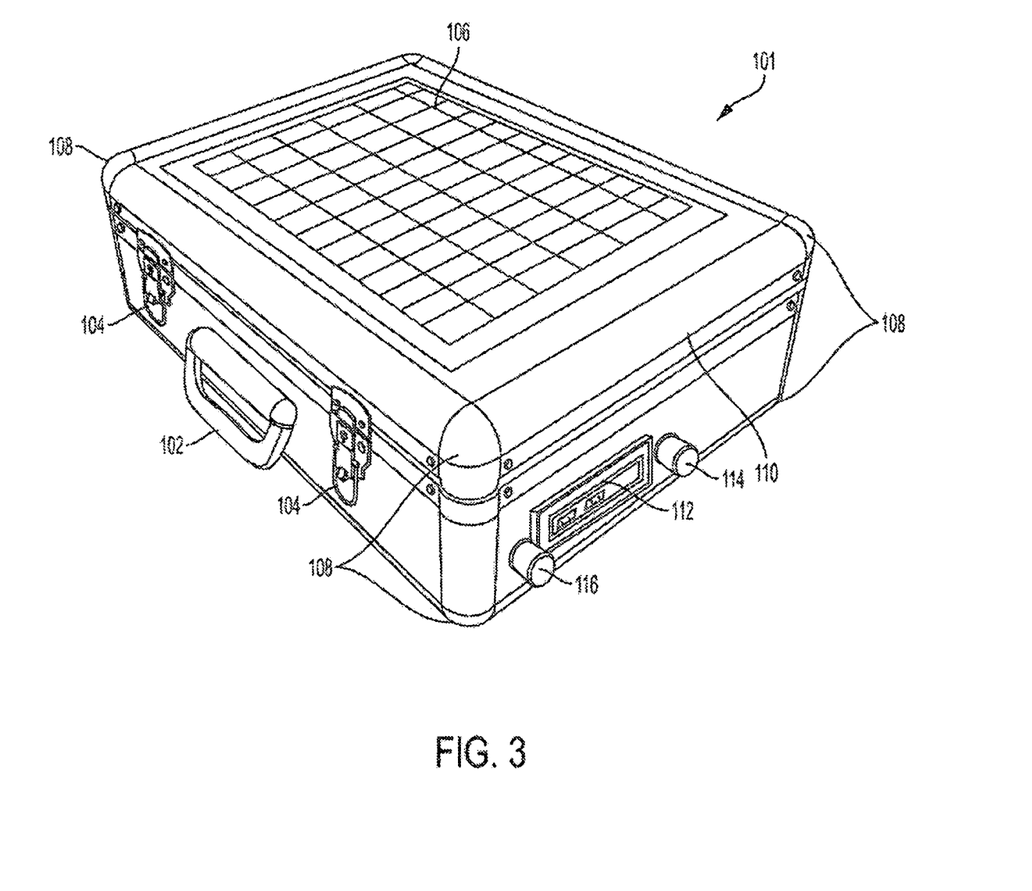
FIG. 3 is a diagram showing another example of a portable power system positioned in an example enclosure.

FIG. 3 is a diagram showing one example of a portable power system 100 positioned in an example enclosure 101. The enclosure 101 may be made of any suitable material, for example, as described herein. In various examples, the enclosure 101 may comprise a handle 102 allowing the system 100 to be lifted and transported, for example, by a single human user. The example enclosure 101 may open along a seam 110. In some examples, components making up the user interface 20 are positioned inside the enclosure 101, for example, to provide protection from the elements. Latches 104 may secure the enclosure 101 in the closed position that is shown. In some examples, the enclosure 101 may be made from a plastic, as described, with corner guards 108 made from a metal, such as steel. The enclosure 101 shown in FIG. 3 comprises an externally positioned solar panel 106. Input knobs 116, 114 and a touch screen 112 may provide input and output capabilities for controlling the system 100.

Figure 4:
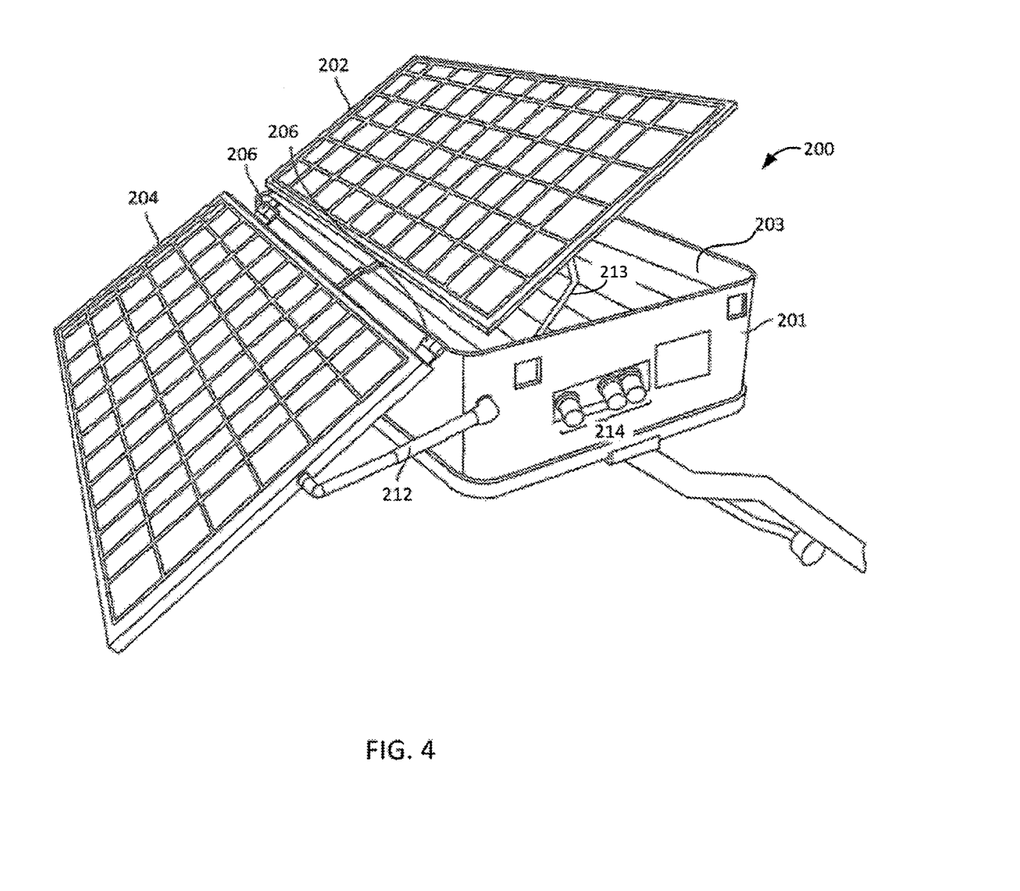
FIG. 4 is a diagram showing an example of an enclosure comprising deployable solar panels.

FIG. 4 is a diagram showing an example of an enclosure 201 comprising deployable solar panels 202, 204. The enclosure 201 is shown in an open position with the solar panels 202, 204, deployed. An extendable strut 212 may support the panel 204 as shown. The panels may be un-deployed by folding panel 204 onto panel 202 along hinges 206. The two panels may be folded over a remainder of the enclosure 201 to transition to a closed state with the panels 202, 204 positioned inside the enclosure 201. The strut 212 may be retracted as the panels 204, 206 are un-deployed. Display lamps 214 are also positioned on an exterior of the enclosure 201. In one embodiment, the strut can be external to the enclosure as shown by 212. In one embodiment, the strut can be carried internal to the enclosure as shown 213.

Figure 5:
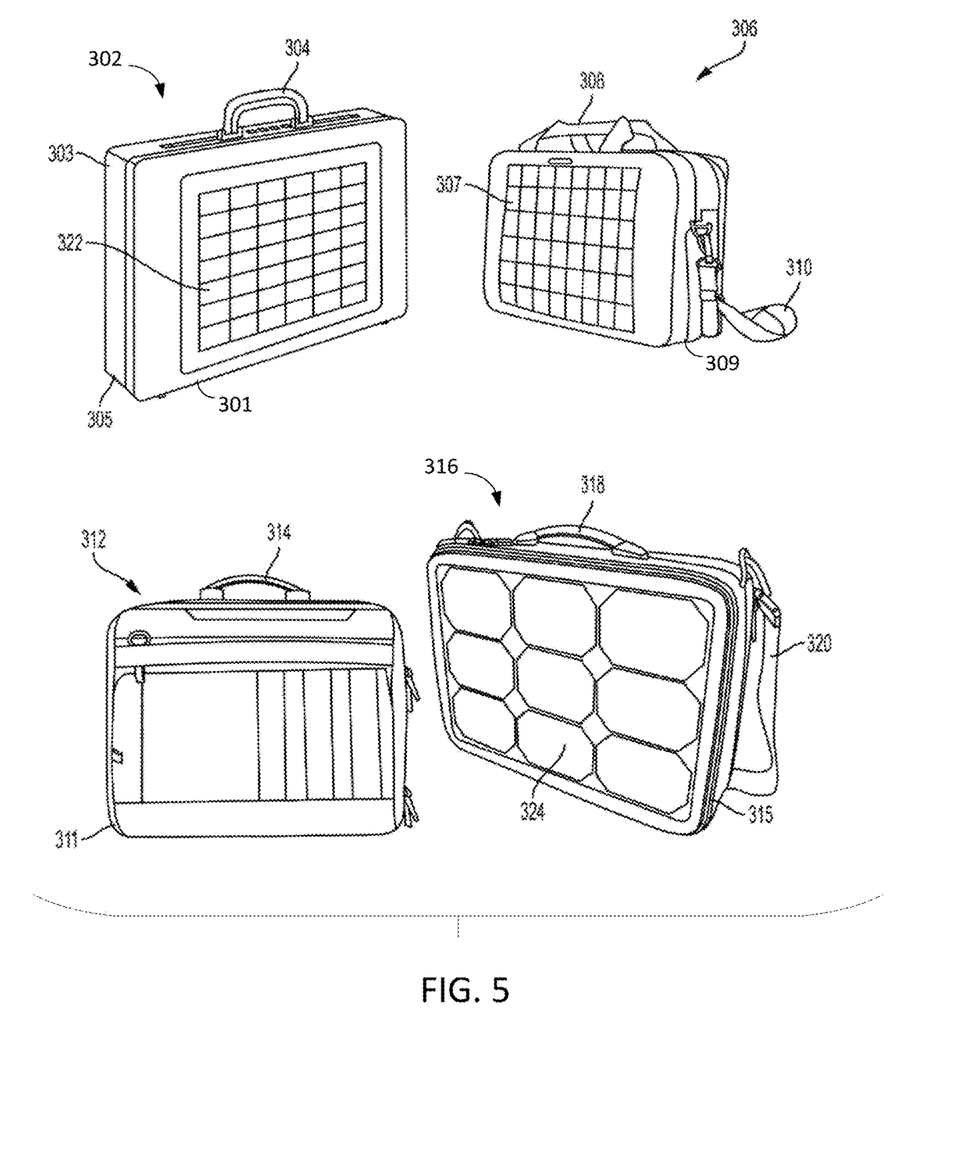
FIG. 5 shows diagrams of various examples of enclosures that may be utilized with portable renewable energy power systems.

FIG. 5 shows diagrams of various examples of enclosures that may be utilized with portable renewable energy power systems. An enclosure 302 may comprise a hard shell material (e.g., plastic, metal, or other suitable material), have a first side 303, a second side 301, and may be hinged to open along hinge 305. The enclosure 302 also comprises a handle 304 for carrying. A solar panel 322 comprising an array of solar cells may be positioned on an exterior portion of the enclosure. An enclosure 306 may be made from a soft nylon material. The enclosure 306 may comprise an external solar panel 307 and may hinge about hinge 309. In some examples, the enclosure 306 may be secured in the closed position by a zipper or other suitable fastener. The enclosure 306 may be usable in multiple orientations. For example, a user may transport the enclosure 306 by grasping handles 308. In some examples, the user may also transport the enclosure 306 utilizing the handle strap 310. The enclosure 312 may hinge about hinge 311 and may comprise a handle 314 for carrying. The enclosure 316 may also hinge about a hinge 315 and may comprise a handle 318 and carrying strap 320. The enclosure 316 may additionally comprise an exterior solar panel 324.

In some examples, multiple portable power systems may be connected in parallel and/or series to act as a single power system. For example, power systems may be connected in series to increase the available voltage output. Power systems may be connected in parallel, for example, to increase the available current and power output. Each power system may be configurable by its control module 16 for multi-unit connection.

In various examples, components of portable power systems described herein may be selected such that the portable power systems meet certain operating parameters. Some examples of portable power systems may be configured to operate between −30° and 70° C. and to tolerate storage at temperatures between −40° and 85° C. Some examples of portable power systems may be configured to operate and be stored at humidity levels between 10% and 95%. Some examples of portable power systems may be configured to operate between 0 and 10,000 feet and be stored between 0 and 40,000 feet. Some examples of portable power systems may be configured to operate through vibrations of 20 Hz to 50 Hz, 10 meters/second$^2$, 0.5 oct/min, along 3 axes. Some examples of portable power systems may be configured to have a shock resistance of at least 294 meters/second$^2$. Some examples of portable power systems may be configured to meet International Protection Specification IP65. Some examples of portable power systems may be configured to meet EN 55022/FCC Class A (Class B targeted) standards for radio disturbance characteristics for information technology equipment. Some examples of portable power systems may be configured to meet EN 55024 immunity characteristics and limits for information technology equipment. Some examples of portable power systems may be configured to be compliant with RoHS environmental regulations.

Reference in the specification to, "examples," "various examples," "some examples," etc. means that a particular feature, structure, or characteristic described in connection with the examples is included in at least one example of the invention. The appearances of the above-referenced phrases in various places in the specification are not necessarily all referring to the same example. Reference to examples is intended to disclose examples, rather than limit the claimed invention. While the invention has been particularly shown and described with reference to several examples, it will be understood by persons skilled in the relevant art that various changes in form and details can be made therein without departing from the spirit and scope of the invention.

It should be noted that the language used in the specification has been principally selected for readability and instructional purposes, and may not have been selected to delineate or circumscribe the inventive subject matter. Accordingly, the present disclosure is intended to be illustrative, but not limiting, of the scope of the invention.

It is to be understood that the figures and descriptions of example embodiments of the present disclosure have been simplified to illustrate elements that are relevant for a clear understanding of the present disclosure, while eliminating, for purposes of clarity, other elements, such as, for example, details of system architecture. Those of ordinary skill in the art will recognize that these and other elements may be desirable for practice of various aspects of the present examples. However, because such elements are well known in the art, and because they do not facilitate a better understanding of the present disclosure, a discussion of such elements is not provided herein.

It is to be understood that the figures and descriptions of example embodiments of the present disclosure have been simplified to illustrate elements that are relevant for a clear understanding of the present disclosure, while eliminating, for purposes of clarity, other elements, such as, for example, details of system architecture. Those of ordinary skill in the art will recognize that these and other elements may be desirable for practice of various aspects of the present examples. However, because such elements are well known in the art, and because they do not facilitate a better understanding of the present disclosure, a discussion of such elements is not provided herein.

It can be appreciated that, in some examples of the present methods and systems disclosed herein, a single component can be replaced by multiple components, and multiple components replaced by a single component, to perform a given command or commands.

Except where such substitution would not be operative to practice the present methods and systems, such substitution is within the scope of the present disclosure. Examples presented herein, including operational examples, are intended to illustrate potential implementations of the present method and system examples. It can be appreciated that such examples are intended primarily for purposes of illustration. No particular aspect or aspects of the example method, product, computer-readable media, and/or system examples described herein are intended to limit the scope of the present disclosure.

It will be appreciated that the various components of the environment 100 may be and/or be executed by any suitable type of computing device including, for example, desktop computers, laptop computers, mobile phones, palm top computers, personal digital assistants (PDA's), etc. As used herein, a "computer," "computer system," "computer device," or "computing device," may be, for example and without limitation, either alone or in combination, a personal computer (PC), server-based computer, main frame, server, microcomputer, minicomputer, laptop, personal data assistant (PDA), cellular phone, pager, processor, including wireless and/or wireline varieties thereof, and/or any other computerized device capable of configuration for processing data for standalone application and/or over a networked medium or media. Computers and computer systems disclosed herein may include operatively associated memory for storing certain software applications used in obtaining, processing, storing and/or communicating data. It can be appreciated that such memory can be internal, external, remote, or local with respect to its operatively associated computer or computer system. Memory may also include any means for storing software or other instructions including, for example and without limitation, a hard disk, an optical disk, floppy disk, ROM (read only memory), RAM (random access memory), PROM (programmable ROM), EEPROM (extended erasable PROM), and/or other like computer-readable media.

Some portions of the above disclosure are presented in terms of methods and symbolic representations of operations on data bits within a computer memory. These descriptions and representations are the means used by those skilled in the art to most effectively convey the substance of their work to others skilled in the art. A method is here, and generally, conceived to be a sequence of actions (instructions) leading to a desired result. The actions are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of actions requiring physical manipulations of physical quantities as modules or code devices, without loss of generality. It should be borne in mind, however, that all of these and similar terms are to be associated with the appropriate physical quantities and are merely convenient labels applied to these quantities. Unless specifically stated otherwise as apparent from the preceding discussion, it is appreciated that throughout the description, discussions utilizing terms such as "processing", "computing", "calculating", "determining", "displaying", or the like, refer to the action and processes of a computer system, or similar electronic computing device, that manipulates and transforms data represented as physical (electronic) quantities within the computer system memories or registers or other such information storage, transmission or display devices.

Certain aspects of the present disclosure include process steps and instructions described herein in the form of a method. It should be noted that the process steps and instructions of the present disclosure can be embodied in software, firmware or hardware, and when embodied in software, can be downloaded to reside on and be operated from different platforms used by a variety of operating systems.

The present disclosure also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers and computer systems referred to in the specification may include a single processor or may be architectures employing multiple processor designs for increased computing capability.

The methods and systems presented herein, unless indicated otherwise, are not inherently related to any particular computer or other apparatus. Various general-purpose systems may also be used with programs in accordance with the teachings herein, or it may prove convenient to construct more specialized apparatus to perform the disclosed method actions. The structure for a variety of these systems will appear from the above description. In addition, although some of the examples herein are presented in the context of a particular programming language, the present disclosure is not limited to any particular programming language. It will be appreciated that a variety of programming languages may be used to implement the teachings of the present disclosure as described herein, and any references above to specific languages are provided for disclosure of enablement and best mode of the present disclosure.

The term "computer-readable medium" as used herein may include, for example, magnetic and optical memory devices such as diskettes, compact discs of both read-only and writeable varieties, optical disk drives, and hard disk drives. A computer-readable medium may also include non-transitory memory storage that can be physical or virtual.

What is claimed is:
1. A portable renewable energy power system, the system comprising:
    an enclosure having a first side hingably attached to a second side carried by the enclosure;

a deployed position wherein a first solar panel and a second solar panel are exposed and face away from the enclosure;

an un-deployed position wherein the first solar panel and the second solar panel are received within the enclosure and covered by the first side and the second side;

a battery module carried by the enclosure;

an alternating current/direct current (AC/DC) converter carried by the enclosure;

a direct current/alternating current (DC/AC) converter carried by the enclosure; and, a control module programmed to configure the system among a plurality of configurations including:

an external charge configuration wherein in the external charge configuration, the system is configured to receive an alternating current (AC), convert the AC to a direct current (DC) with the AC/DC converter, and provide the DC to charge the battery module;

a solar charge configuration wherein in the solar charge configuration, the system is configured to receive solar generated power generated from at least of the first solar panel and the second solar panel, and charge the battery module with the solar generated power; and, a solar and battery configuration wherein in the solar and battery configuration, the system is configured to convert the DC from at last one of the first solar panel and the second solar panel, and battery to an output AC with the DC/AC converter and an output DC.

2. The system of claim 1 wherein at least one of the first solar panel and the second solar panel is foldable along a hinge.

3. The system of claim 1 including a strut carried by the enclosure for supporting at least one of the first solar panel and the second solar panel away from the enclosure.

4. The system of claim 1 wherein the control module is further programmed to configure the system according to a hybrid power configuration wherein in the hybrid power configuration, the system is configured to receive a solar generated power, convert the solar generated power to a solar AC with the DC/AC converter, provide the solar AC to a load, determine that the solar AC is insufficient to drive the load, convert a battery generated power to a battery AC with the DC/AC converter, and provide the battery AC to the load.

5. A portable renewable energy power system, the system comprising:

an enclosure having a solar module, a battery module, an alternating current/direct current (AC/DC) converter and a direct current/alternating current (DC/AC) converter;

a control module carried by the enclosure comprising at least one processor, wherein the control module is programmed to configure the system according to:

a solar charge configuration wherein in the solar charge configuration, the system is configured to receive solar generated power generated by the solar module and charge the battery with the solar generated power;

a battery only configuration wherein in the battery only configuration, the system is configured to convert the DC from the battery to an output AC with the DC/AC converter and an output DC;

a solar only configuration wherein in the solar only configuration, the system is configured to convert the DC from the solar module to an output AC with the DC/AC converter and an output DC;

a solar and battery configuration wherein in the solar and battery configuration, the system is configured to convert the DC from the solar module and battery to an output AC with the DC/AC converter and an output DC; and, a hybrid power configuration wherein in the hybrid power configuration, the system is configured to receive a solar generated power, convert the solar generated power to a solar AC with the DC/AC converter; provide the solar AC to a load, determine that the solar AC is insufficient to drive the load, convert a battery generated power signal to a battery AC with the DC/AC converter; and, provide the battery AC to the load.

6. The system of claim 5 including a first side hingably attached to a second side.

7. The system of claim 5 including:

a deployed position wherein a first solar panel and a second solar panel are exposed; and, an un-deployed position wherein the first solar panel and the second solar panel are positioned in the enclosure.

8. The system of claim 5 wherein the solar module is hingably attached to the enclosure.

9. The system of claim 5 including a user interface having a display.

* * * * *

UNITED STATES PATENT AND TRADEMARK OFFICE
CERTIFICATE OF CORRECTION

| | | |
|---|---|---|
| PATENT NO. | : 10,084,213 B2 | |
| APPLICATION NO. | : 15/829465 | |
| DATED | : September 25, 2018 | |
| INVENTOR(S) | : Daniel Conti | |

It is certified that error appears in the above-identified patent and that said Letters Patent is hereby corrected as shown below:

On the Title Page

Item (12) should read:
-- Conti --

"(72) Inventor: Christopher J. Petrella, Spindale, NC (US)"
Should read:
-- (72) Inventor: Daniel Conti, Weaverville, NC (US) --

Signed and Sealed this
Thirty-first Day of May, 2022

*Katherine Kelly Vidal*

Katherine Kelly Vidal
*Director of the United States Patent and Trademark Office*